United States Patent
Nakano

(10) Patent No.: US 8,239,793 B2
(45) Date of Patent: Aug. 7, 2012

(54) ROUTING DESIGN METHOD, ROUTING DESIGN APPARATUS AND RECORDING MEDIUM STORING ROUTING DESIGN PROGRAM

(75) Inventor: Mikio Nakano, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 434 days.

(21) Appl. No.: 12/553,840

(22) Filed: Sep. 3, 2009

(65) Prior Publication Data

US 2010/0100863 A1  Apr. 22, 2010

(30) Foreign Application Priority Data

Oct. 21, 2008  (JP) ................................. 2008-271227

(51) Int. Cl.
*G06F 17/50* (2006.01)
(52) U.S. Cl. ........ 716/106; 716/107; 716/111; 716/112; 716/126; 716/136; 716/137
(58) Field of Classification Search .......... 716/106–108, 716/110–112, 126, 136–138
See application file for complete search history.

(56) References Cited

U.S. PATENT DOCUMENTS 8,006,216 B1 * 8/2011 Chen et al. .................... 716/126

FOREIGN PATENT DOCUMENTS

JP  2007-102381 A  4/2007
JP  2008-123341 A  5/2008

* cited by examiner

*Primary Examiner* — Paul Dinh
(74) *Attorney, Agent, or Firm* — Knobbe, Martens, Olson & Bear LLP

(57) ABSTRACT

In a routing design method for designing routing of a SiP having first and second routing portions that are connected to each other via bonding wires, whether a DRC error of the first or second routing portion is present or not is determined and the DRC error is selected when the DRC error is present. A plurality of nets associated with the selected DRC error are specified and the routes of the specified nets are removed. Then, bonding wire allocations of the specified nets are changed. Further, the specified nets are rerouted so as not to cause a DRC error and whether the rerouting result is accepted or not is determined.

17 Claims, 14 Drawing Sheets

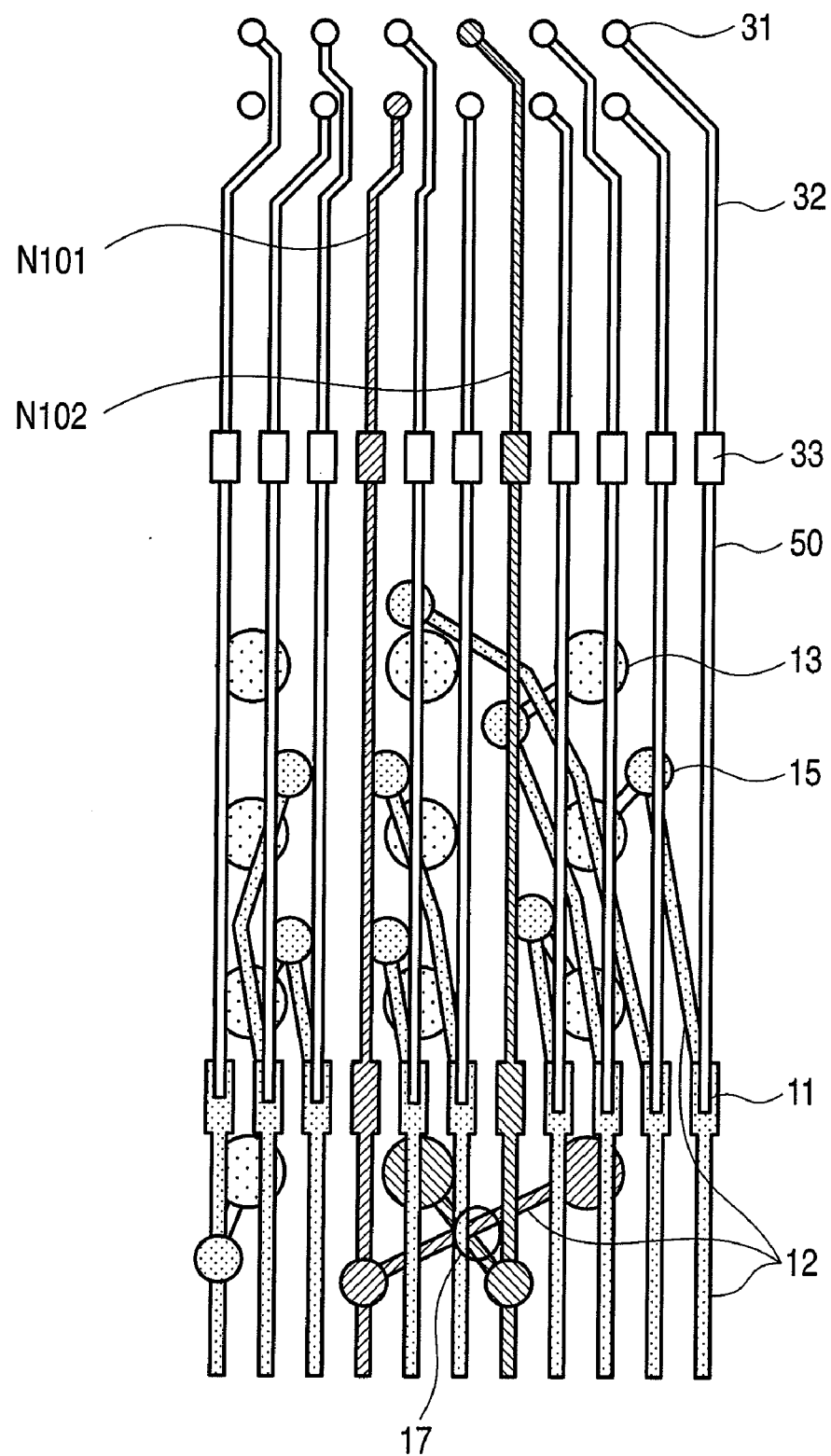
F I G. 5

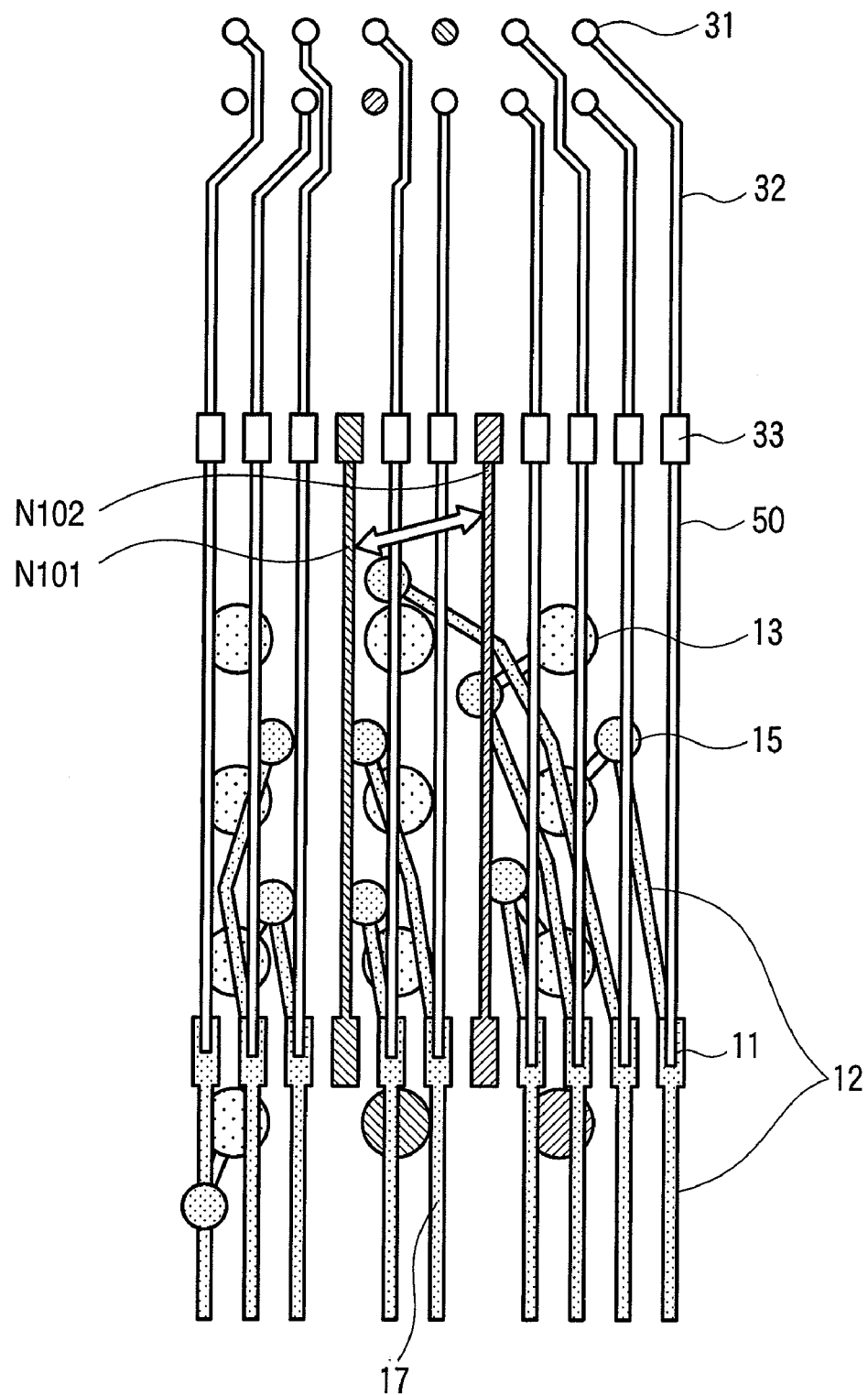
F I G. 7

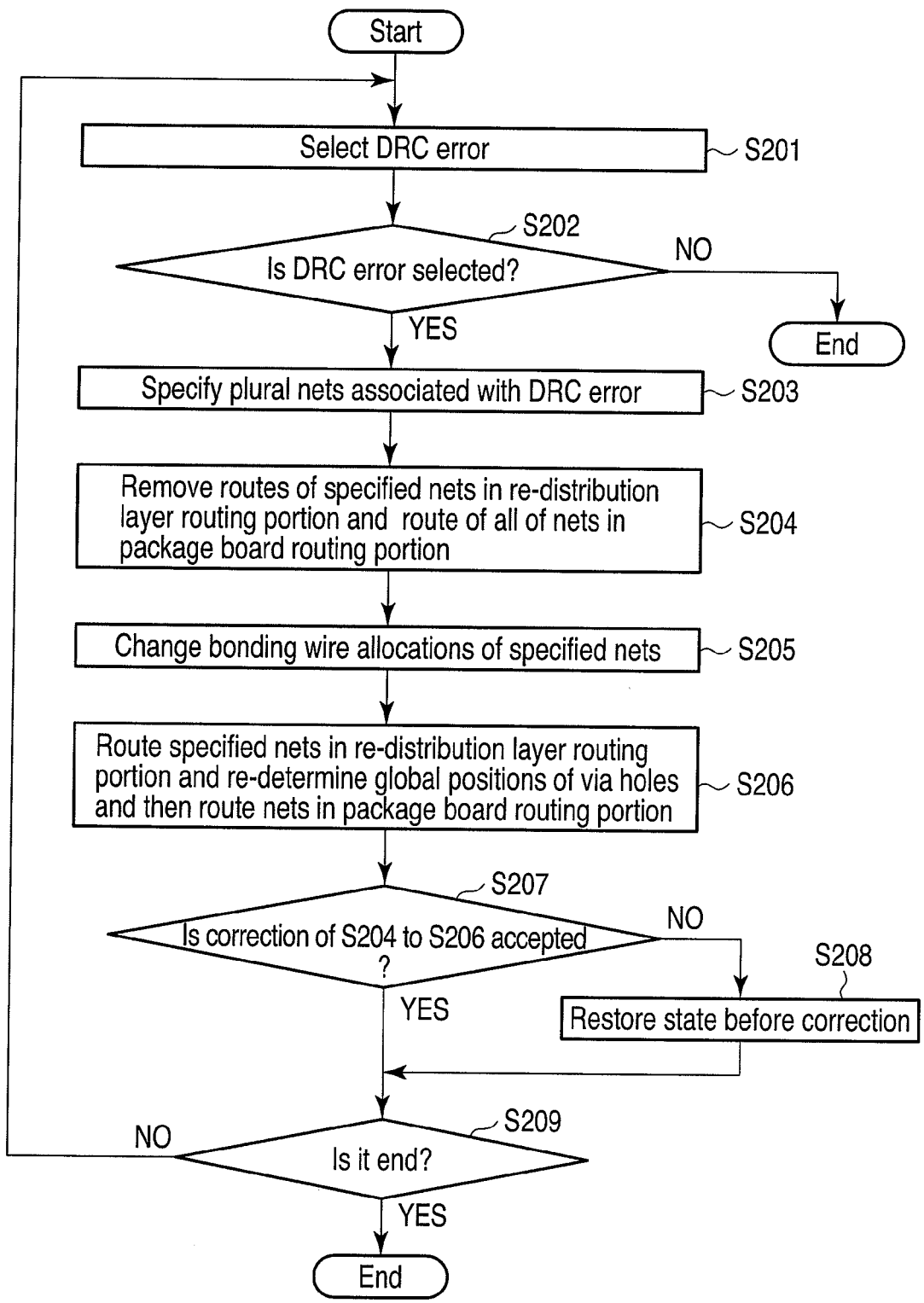
F I G. 10

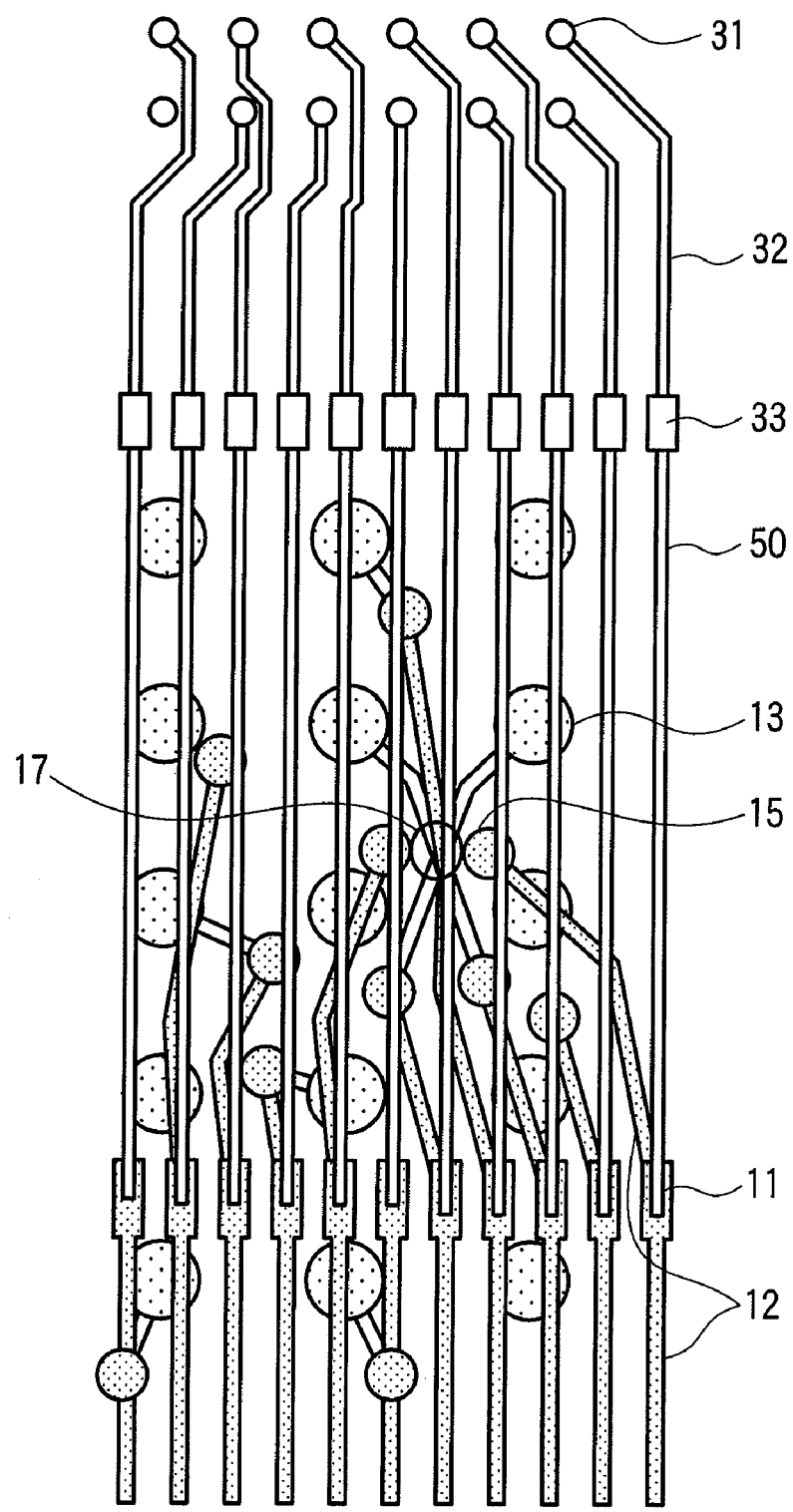
F I G. 11

ROUTING DESIGN METHOD, ROUTING DESIGN APPARATUS AND RECORDING MEDIUM STORING ROUTING DESIGN PROGRAM

CROSS-REFERENCE TO RELATED APPLICATIONS

This application is based upon and claims the benefit of priority from prior Japanese Patent Application No. 2008-271227, filed Oct. 21, 2008, the entire contents of which are incorporated herein by reference.

BACKGROUND OF THE INVENTION

1. Field of the Invention

This invention relates to a routing design method for working out a routing design for a system in package (SiP), a routing design apparatus and a recording medium that stores a routing design program.

2. Description of the Related Art

Recently, a SiP having a plurality of LSI chips stacked on a package board is developed. For example, in a SiP having a lower chip mounted on the package board and an upper chip mounted on the lower chip with a re-distribution layer disposed therebetween, the upper chip is electrically connected to the package board via bonding wires. Specifically, a signal input/output terminal of the upper chip is formed to extend from a bump of the upper chip to a solder ball of the package board via a re-distribution layer route, bonding pad, bonding wire, bonding finger and package board route (for example, see Jpn. Pat. KOKAI Publication No. 2008-123341).

Algorithms suitable for coping with routing problems that are used for a routing portion (re-distribution layer routing portion) extending from the bump of the upper chip to the bonding pad and a routing portion (package board routing portion) extending from the bonding finger to the solder ball are different from each other. Therefore, in the prior art technique, the re-distribution layer routing portion and package board routing portion are individually optimized at the time of routing design of each routing portion.

However, if the re-distribution layer routing portion and package board routing portion are individually optimized, allocation of nets to the bonding wire is determined according to the state of a routing portion that is previously routed, and therefore, allocation for a routing portion that is later routed may become unfavorable. This causes a problem that the routing efficiency of the routing portion later routed is lowered, for example, the number of design rule check (DRC) errors increases.

BRIEF SUMMARY OF THE INVENTION

According to one aspect of this invention, there is provided a routing design method that includes determining whether a DRC error of one of first and second routing portions is present in a SiP having LSI chips stacked on a package board that has via holes formed to connect upper and lower routes and having the first and second routing portions that are connected to each other via bonding wires and selecting the DRC error when the DRC error is present, specifying a plurality of nets associated with the selected DRC error, removing at least part of routes of the specified nets, changing bonding wire allocations of the specified nets, and rerouting nets that are subjected to the route removal step and bonding wire allocation changing step while occurrence of a DRC error is prevented after the removal step and allocation changing step and determining whether a result of the rerouting is accepted.

According to another aspect of this invention, there is provided a routing design apparatus including a selection module that determines whether a DRC error of one of first and second routing portions is present in a SiP having LSI chips stacked on a package board that has via holes formed to connect upper and lower routes and having the first and second routing portions that are connected to each other via bonding wires and selects the error when the DRC error is present, a net specification module that specifies a plurality of nets associated with the selected DRC error, a route removal module that removes at least part of routes of the specified nets, a net allocation changing module that changes bonding wire allocations of the specified nets, a rerouting module that reroutes nets that are subjected to the route removal step and bonding wire allocation changing step while occurrence of a DRC error is prevented, and a determination module that determines whether a result of the rerouting is accepted.

According to still another aspect of this invention, there is provided a recording medium including a routing design program that is read by a computer and used to optimize routes of routing portions by computer control with respect to a SiP having LSI chips stacked on a package board that has via holes formed to connect upper and lower routes and having first and second routing portions that are connected to each other via bonding wires, wherein the program causes the computer to perform a process of determining whether a DRC error is present in one of the first and second routing portions and selecting the DRC error when the DRC error is present, a process of specifying a plurality of nets associated with the selected DRC error, a process of removing at least part of routes of the specified nets, a process of changing bonding wire allocations of the specified nets, a process of rerouting nets that are subjected to the route removal step and bonding wire allocation changing step while occurrence of a DRC error is prevented after the separating and allocation changing processes, and a process of determining whether a result of the rerouting is accepted.

BRIEF DESCRIPTION OF THE SEVERAL VIEWS OF THE DRAWING

FIG. 5 is a plan view showing the state in which nets associated with DRC errors are specified in the first embodiment.

FIG. 7 is a plan view showing the state in which allocation of the specified nets to bonding wires is changed in the first embodiment.

FIG. 10 is a flowchart for illustrating a routing design method according to a second embodiment of this invention.

FIG. 11 is a plan view showing an example of a routing problem in the second embodiment.

DETAILED DESCRIPTION OF THE INVENTION

Embodiments of the present invention will be described below in detail with reference to the accompanying drawings.

First Embodiment

Figure 1:
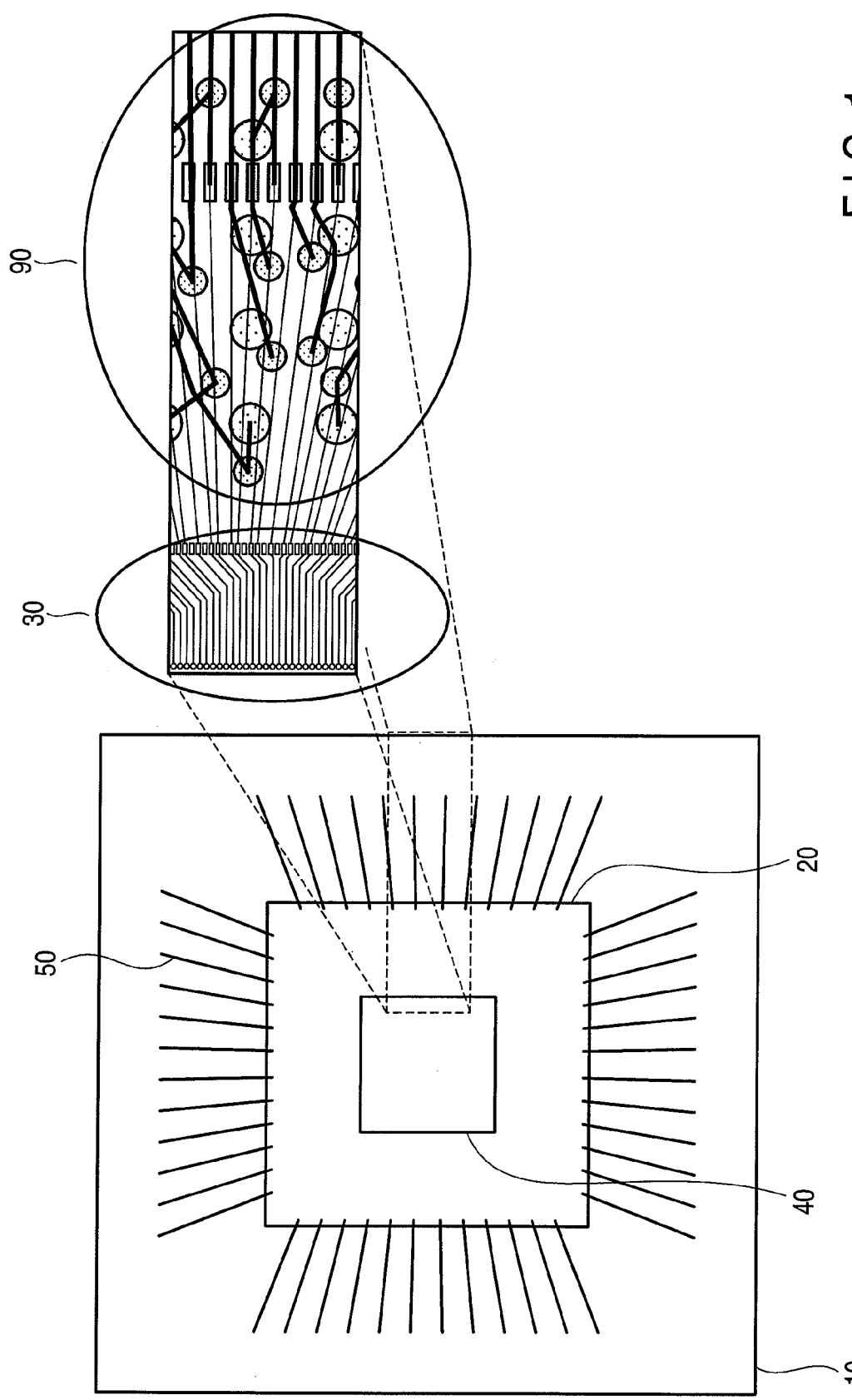
FIG. 1 is a plan view showing the routing state in a SiP according to a first embodiment of this invention.
Figure 2:
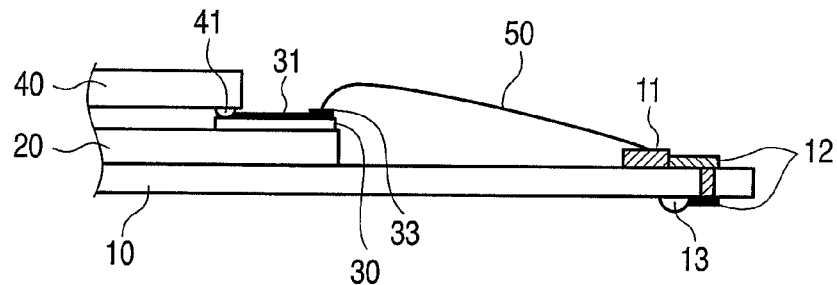
FIG. 2 is a cross-sectional view showing the routing state in the SiP according to the first embodiment.

FIGS. 1 and 2 illustrate the routing state in a SiP according to a first embodiment of this invention, FIG. 1 being a plan view and FIG. 2 being a cross-sectional view.

In the drawing, a symbol 10 indicates a rectangular package board and a first LSI chip (lower chip) 20 is mounted on the central portion of the board 10. A re-distribution layer routing portion 30 is provided on a peripheral portion of the lower chip 20 and a second LSI chip (upper chip) 40 is mounted on the lower chip 20 with the re-distribution layer routing portion 30 disposed therebetween.

Re-distribution layer routes 31 and bonding pads 33 are provided on the re-distribution layer routing portion 30, and bumps 41 are formed on the undersurface of the upper chip 40 and connected to portions of the re-distribution layer routes 31. Bonding fingers 11 and package board routes 12 are formed on the package board 10, solder balls 13 are formed on the undersurface of the package board 10 and portions of the package board routes 12 are connected to the solder balls 13 through via holes formed to penetrate the package board 10. Bonding wires 50 are connected between the bonding pads 33 on the re-distribution layer routing portion 30 and the bonding fingers 11 on the package board 10.

That is, the upper chip 40 is connected to the solder balls 13 from the bumps 41 of the chip 40 via the re-distribution layer routes 31, the bonding pads 33, bonding wires 50, bonding fingers 11 and the package board routes 12.

In the conventional case, the re-distribution layer routing portion 30 (second routing portion) that is a routing extending from the bumps 41 on the upper chip 40 to the bonding pads 33 and a package board routing portion 90 (first routing portion) formed to extend from the bonding fingers 11 to the solder balls 13 are individually optimized. However, in this embodiment, they are simultaneously optimized.

Figure 3:
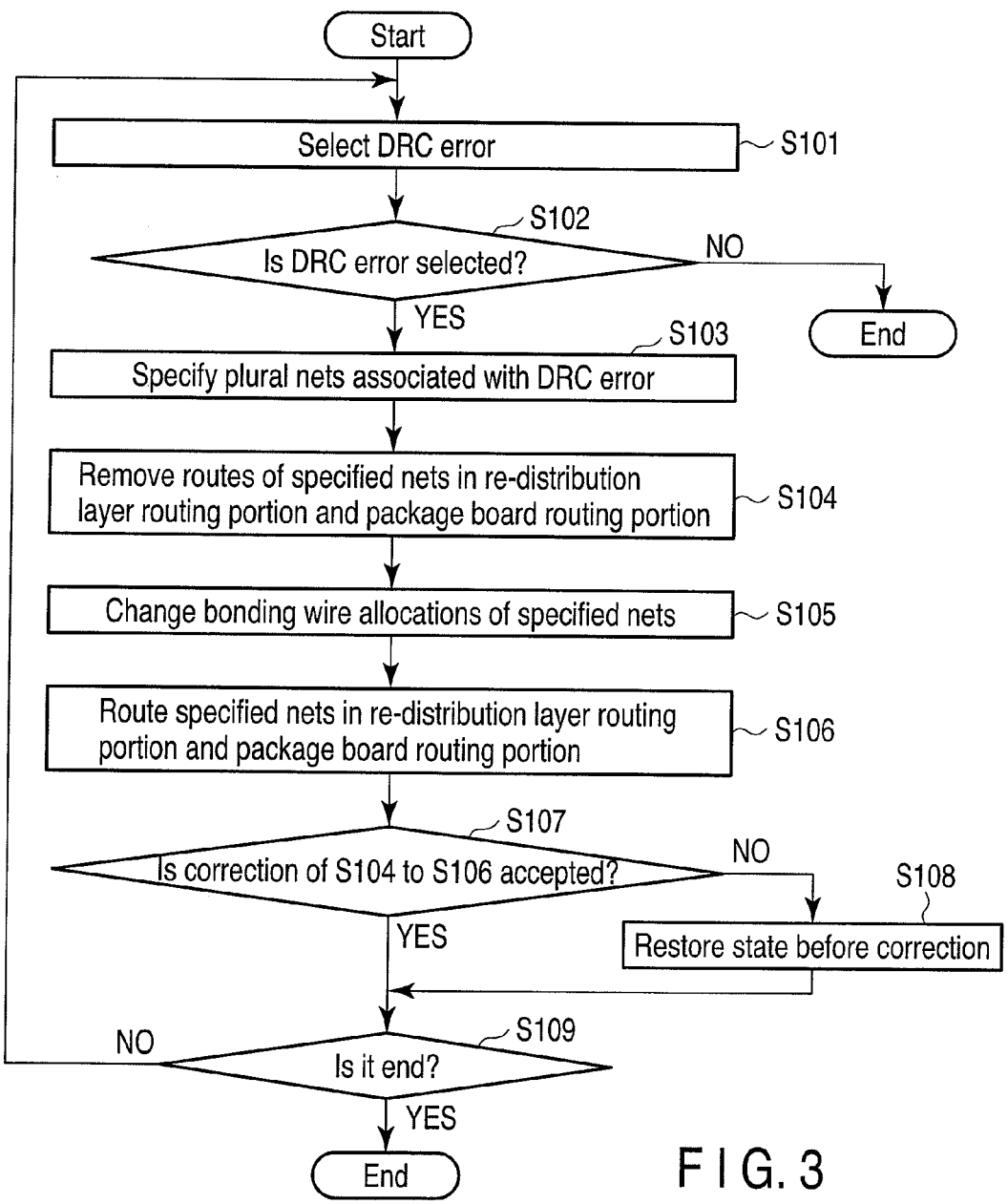
FIG. 3 is a flowchart for illustrating a routing design method according to the first embodiment.

FIG. 3 is a flowchart for illustrating a routing design method according to this embodiment. Next, the steps in the flowchart of FIG. 3 are explained below with reference to FIGS. 4 to 8.

First, it is supposed that package board routes 12 and re-distribution layer routes 31 are designed with respect to a SiP having LSI chips 20, 40 stacked on a package board 10 by use of a normal design method and allocation of bonding wires 50 that connect the above routes is previously determined.

Figure 4:
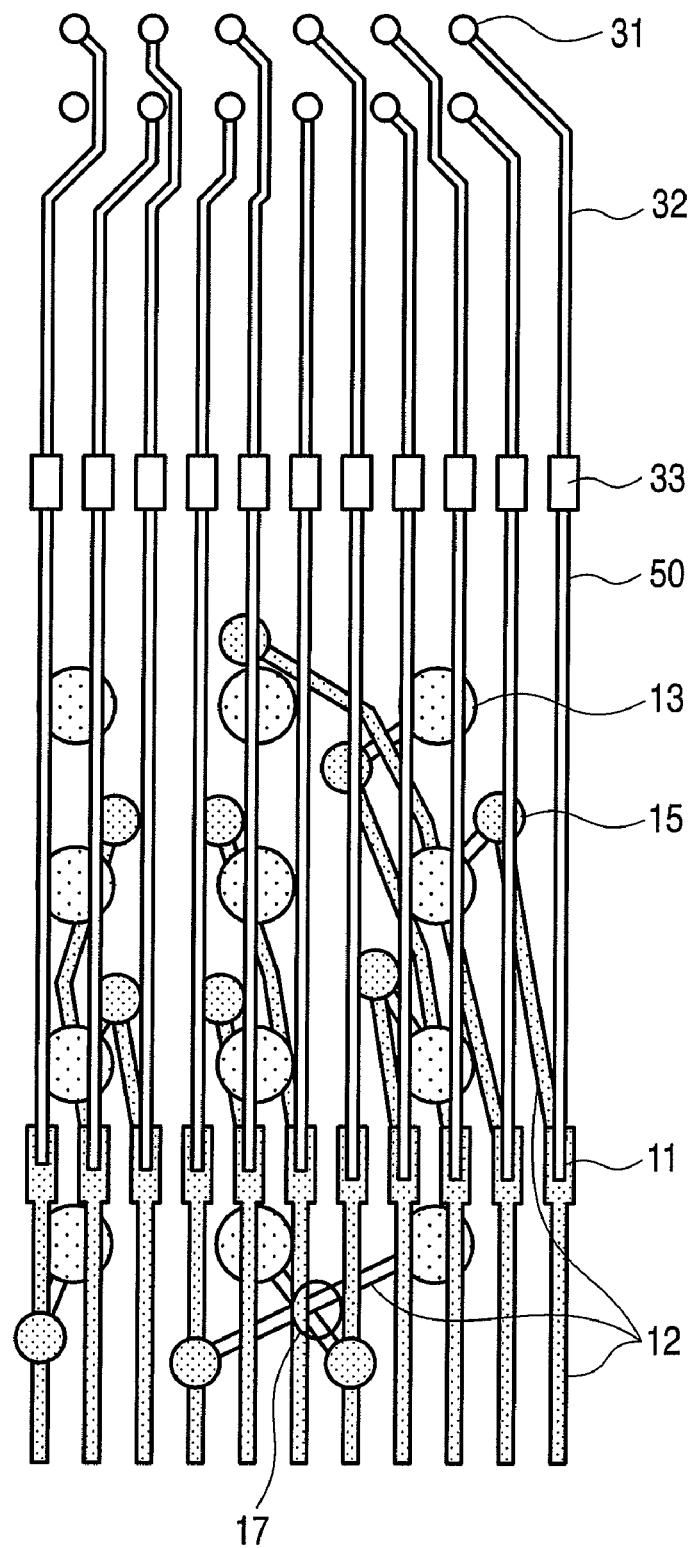
FIG. 4 is a plan view showing an example of a routing problem in the first embodiment.

DRC errors of the routing portions 30, 90 are detected in the SiP in step S101, and if the DRC errors are present, one of the DRC errors is selected. In the case of FIG. 4, it is supposed that one DRC error 17 is present in the package board routing portion 90 and the DRC error is selected. In this example, the DRC error is present in the package board routing portion 90, but a DRC error present in the re-distribution layer routing portion 30 may be selected in some cases.

Whether a DRC error has been selected or not is determined in step S102. If a DRC error is not selected, the process is terminated. In other cases, the process proceeds to step S103.

In step S103, a net associated with the selected DRC error is specified. In this example, nets N101, 102 shown in FIG. 5 are selected.

Figure 6:
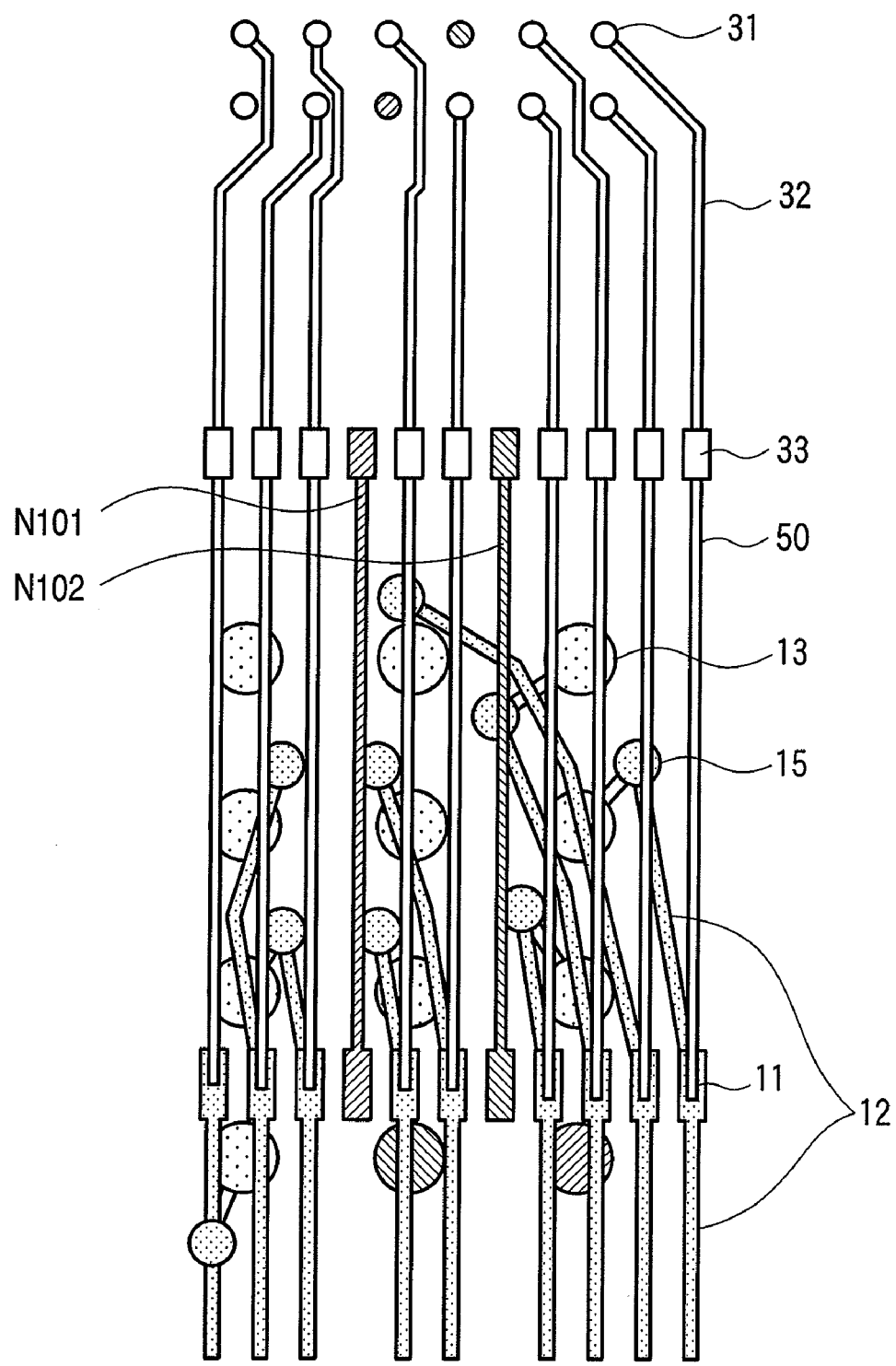
FIG. 6 is a plan view showing the state in which the specified nets are removed in the first embodiment.

In step S104, the routes of the specified nets N101, N102 are removed in both of the re-distribution layer routing portion 30 and package board routing portion 90. The state in which the routes are removed is shown in FIG. 6.

In step S105, bonding wire allocations of the specified nets N101, N102 are changed. In FIG. 7, as indicated by an arrow, net allocations of the bonding wires 50 corresponding to the nets N101, N102 are swapped In step S106, routes are formed in both of the re-distribution layer routing portion 30 and package board routing portion 90 for the specified nets N101, N102. That is, the routes in the re-distribution layer routing portion 30 and package board routing portion 90 are simultaneously optimized. The result of routing obtained at this time is shown in FIG. 8.

In step S107, whether a correction of the routing performed in steps S104 to S106 is accepted or not is determined. If the correction is accepted, the process proceeds to step S109, and if not, the process proceeds to step S108.

Figure 8:
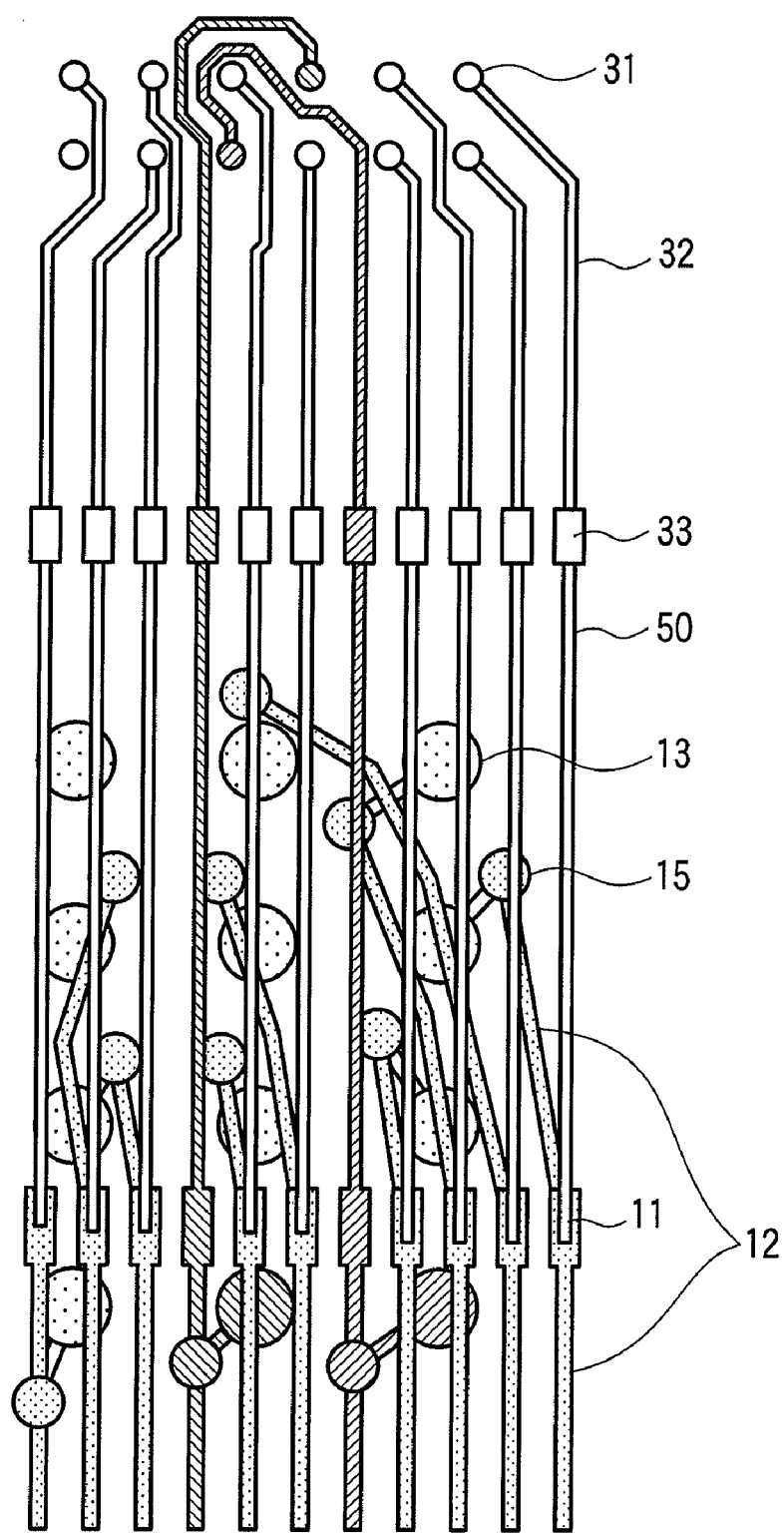
FIG. 8 is a plan view showing the state in which the specified nets are rerouted in the first embodiment.

In this example, since the DRC error present in FIG. 4 is eliminated in FIG. 8, it is understood that improvement is made and the correction is accepted. If the number of DRC errors increases and the result of correction becomes worse, the correction is not accepted and the state before correction is restored in step S108.

In step S109, whether the process is terminated or not is determined. If the process is not terminated, another DRC error is selected in step S101 and the process from step S101 to step S109 is repeatedly performed.

By performing the above procedure, the re-distribution layer routing portion 30 and package board routing portion 90 can be simultaneously optimized and the routing result with better quality in comparison with the conventional technique can be attained.

Thus, according to this embodiment, the routing result with better quality than in a case wherein the routes of the re-distribution layer routing portion 30 and package board routing portion 90 are individually optimized can be attained by simultaneously optimizing the routes of the respective routing portions with respect to a net in which a DRC error occurs in the SiP routing design step.

That is, basically, the efficient routing design can be made by optimizing the routes by using an algorithm suitable for each of the package board routing portion 90 and re-distribution layer routing portion 30. In addition to this, the routing result with better quality can be attained by reducing the number of DRC errors by simultaneously optimizing the package board routing portion 90 and re-distribution layer routing portion 30 than by individually optimizing the respective routing portions for a portion in which a DRC error occurs. In other words, the routing result with better quality can be attained while the efficient routing design is made.

The routing design method of this embodiment can be performed by use of individual hardware structures, but can be performed by means of a computer that is operated according to a program.

Figure 9:
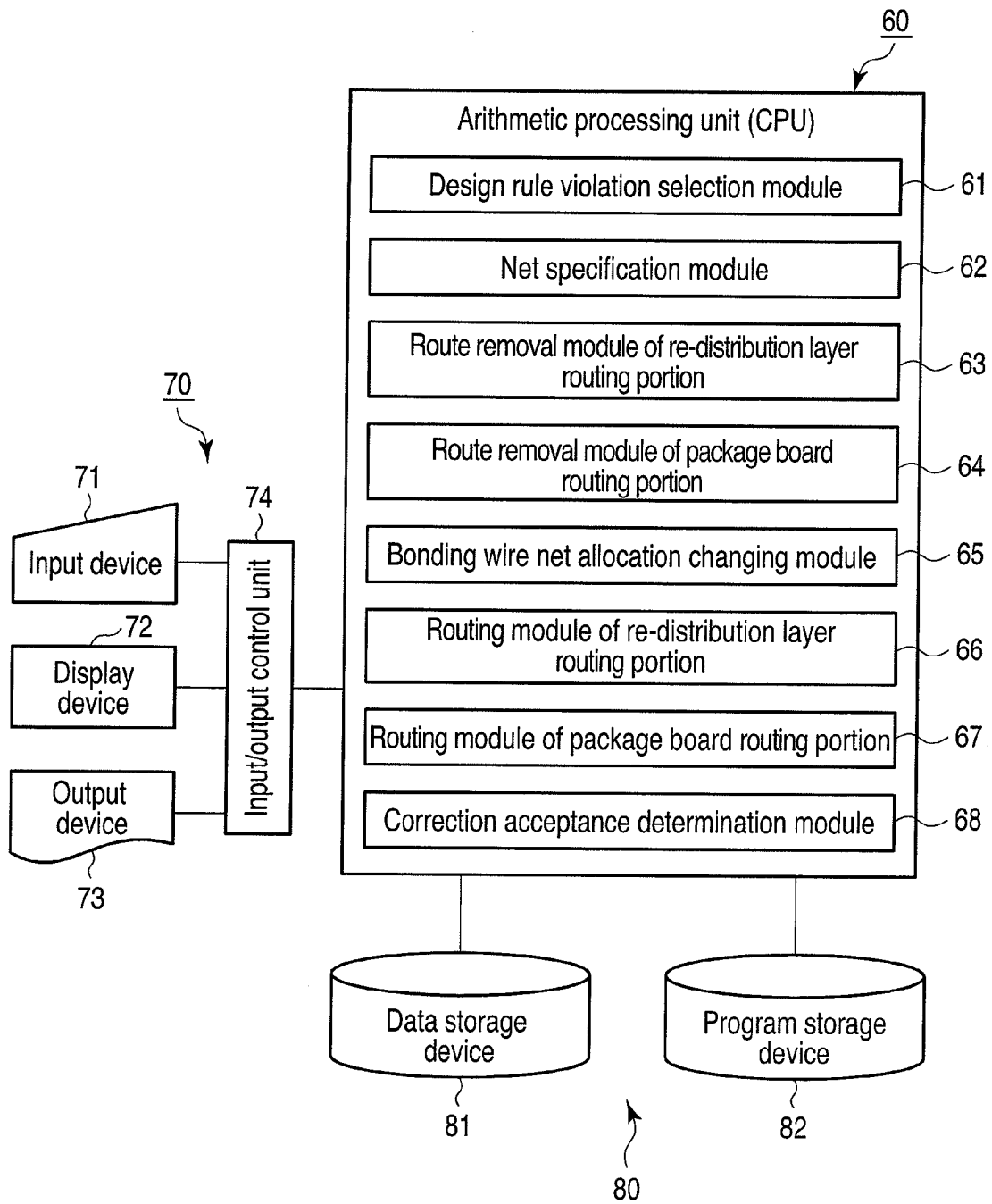
FIG. 9 is a block diagram showing the schematic configuration of a SiP routing design apparatus according to the first embodiment.

FIG. 9 is a block diagram showing a SiP routing design apparatus based on a computer control operation used in the first embodiment of this invention.

The apparatus includes an arithmetic processing unit (CPU) 60 that performs various processes, input/output unit 70 and storage unit 80.

The CPU 60 includes a design rule violation selection module 61 that selects a DRC error, a net specification module 62 that specifies a net associated with the selected DRC error, a route removal module 63 that removes the route of the re-distribution layer routing portion 30 of the specified net, and a route removal module 64 that removes the route of the package board routing portion 90 of the specified net. Further, it includes a bonding wire net allocation changing module 65 that changes bonding wire allocation of the specified net, a routing module 66 that reroutes the net specified by the re-distribution layer routing portion 30, a routing module 67 that reroutes the net specified by the package board routing portion 90, and a correction acceptance determination module 68 that determines whether a correction of the routing is accepted or not.

As the input/output unit 70, an input device 71 such as a keyboard, a display device 72 such as a display, an output device 73 such as a printer and an input/output control unit 74 that connects the above devices 71, 72, 73 to the CPU 60 are provided. As the storage unit 80, a data storage device 81 that stores routing and data necessary for routing and a program storage device 82 that stores a program are provided. As the storage devices 81, 82, a magnetic disk, optical disk or semiconductor memory can be used. Further, a program previously recorded on a recording medium such as an optical disk is read and stored into the storage device 82.

In the apparatus of FIG. 9, the routing and data necessary for the routing of the SiP are read from the data storage device 81 by means of the CPU 60, a routing design program is read from the program storage device 82 and the respective modules 61 to 68 of the CPU 60 are operated according to the program. Thus, the process can be performed according to the flowchart shown in FIG. 3 under the control of the computer. The routing result can be output to the display device 72 and output device 73.

Second Embodiment

Generally, the routing process of a package board is performed by first determining global positions of via holes and then performing global routing and detailed routing. In the rerouting process of the package board routing portion 90 in the first embodiment described before, the effect of the improvement is limited if the global positions of the via holes are kept unchanged since only a process of removing the specifically routed route and a rerouting process are performed.

Therefore, in this embodiment, nets to be removed in step S104 in the first embodiment are used for routing of all of the nets in the package board routing portion 90 and the process for routing of the package board routing portion 90 in step S106 in the first embodiment is restarted from the step of determining the global positions of the via holes.

FIG. 10 is a flowchart for illustrating a routing design method according to this embodiment. Respective steps in the flowchart will be explained below with reference to FIGS. 11 to 15.

This embodiment is different from the first embodiment in that all of the nets of the package board routing portion 90 are removed in step S204 and the process for routing of the package board routing portion 90 is restarted from a step of determining the global positions of via holes in step S206.

Specifically, in step S201, a DRC error is detected and if DRC errors are present, one of the DRC errors is selected. In FIG. 11, it is supposed that one DRC error 17 is present in the package board routing portion 90 and the DRC error is selected.

In step S202, whether the DRC error is selected or not is determined. If the DRC error is not selected, the process is terminated. Otherwise, the process proceeds to step S203.

Figure 12:
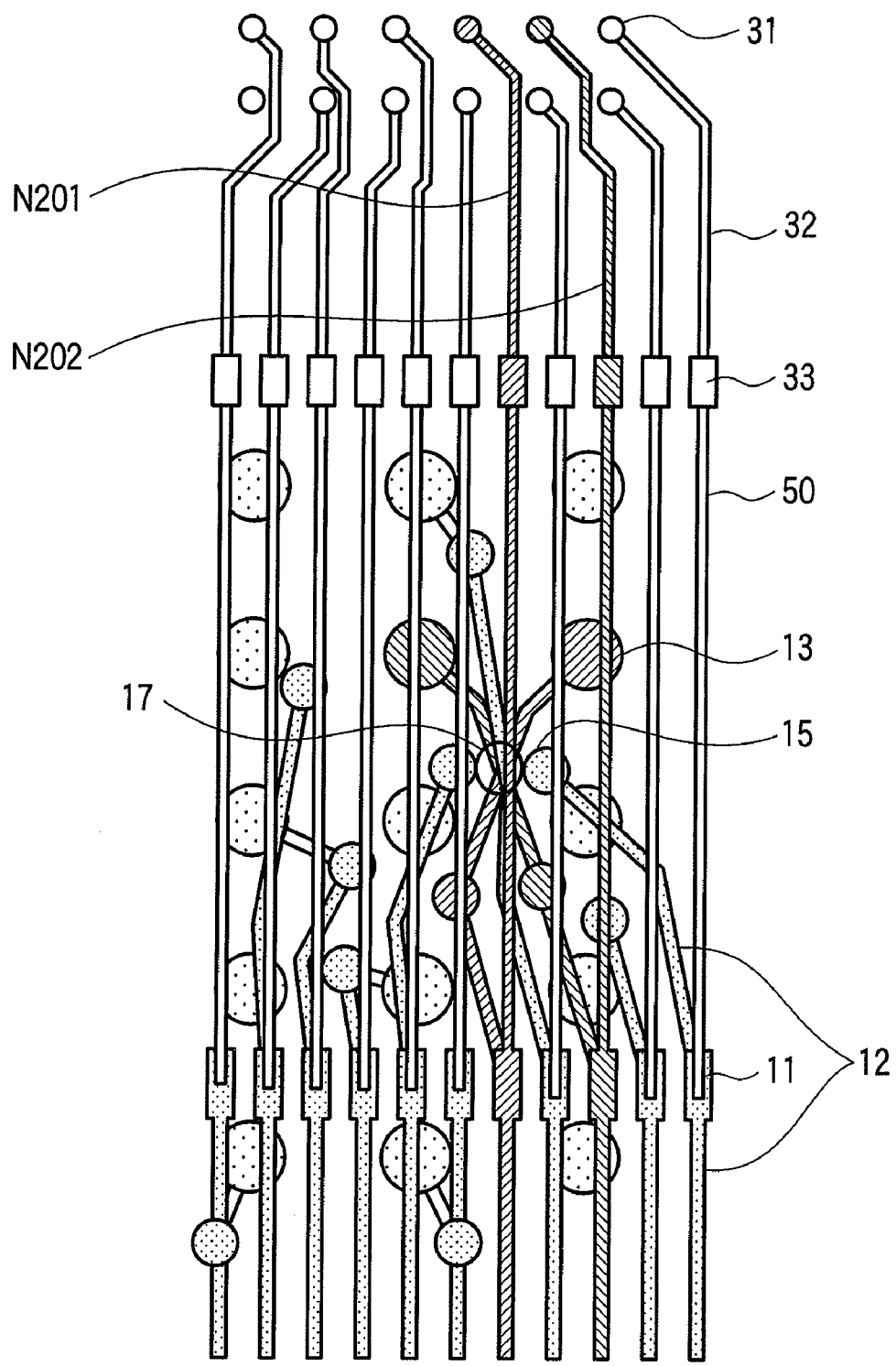
FIG. 12 is a plan view showing the state in which nets associated with DRC errors are specified in the second embodiment.

In step S203, a net associated with the selected DRC error is specified. In this example, nets N201, 202 shown in FIG. 12 are selected.

Figure 13:
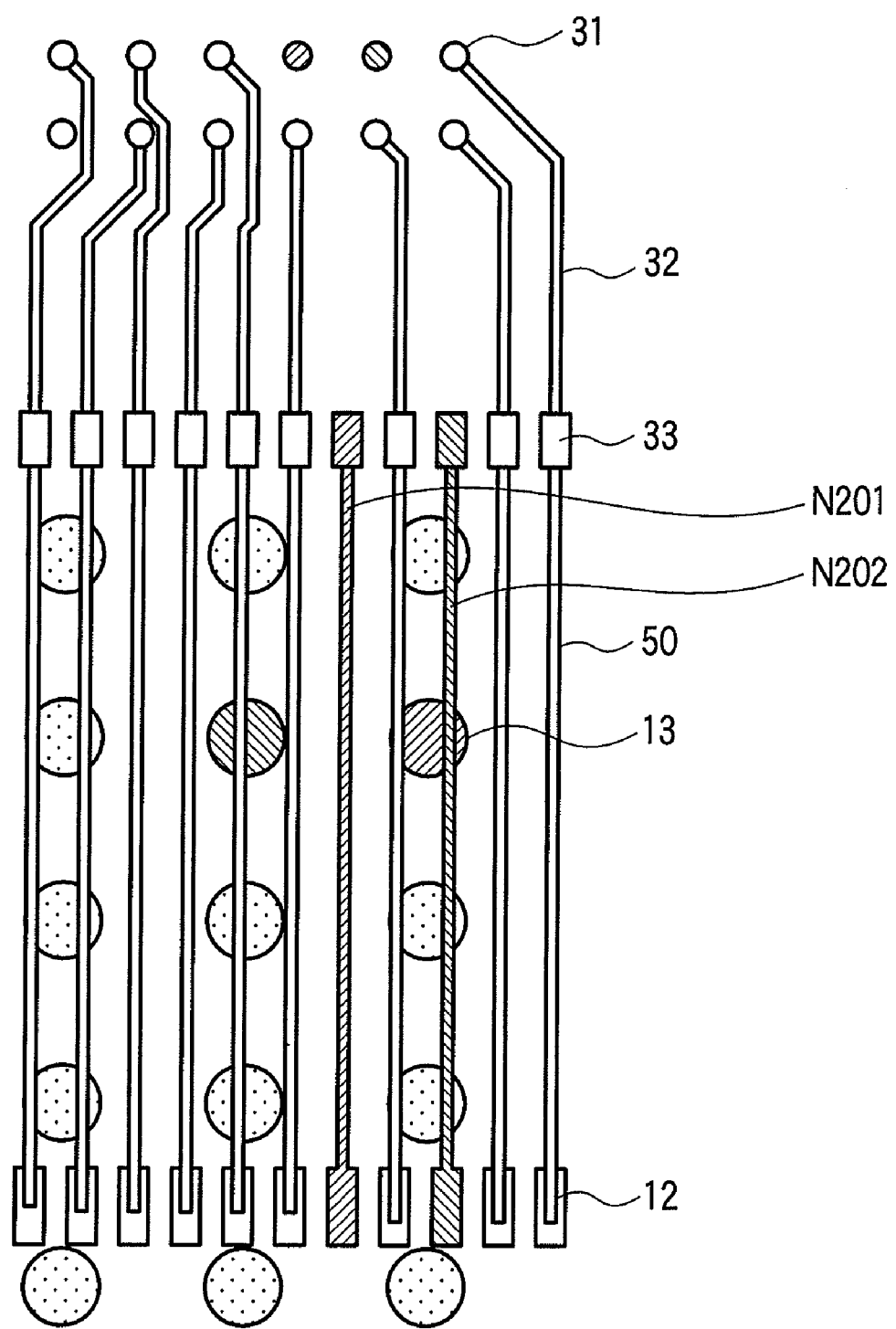
FIG. 13 is a plan view showing the state in which the specified nets are removed in the second embodiment.

In step S204, the routes of the specified nets of the re-distribution layer routing portion 30 and the routes of all of the nets of the package board routing portion 90 are removed. The state in which the routes are removed is shown in FIG. 13.

Figure 14:
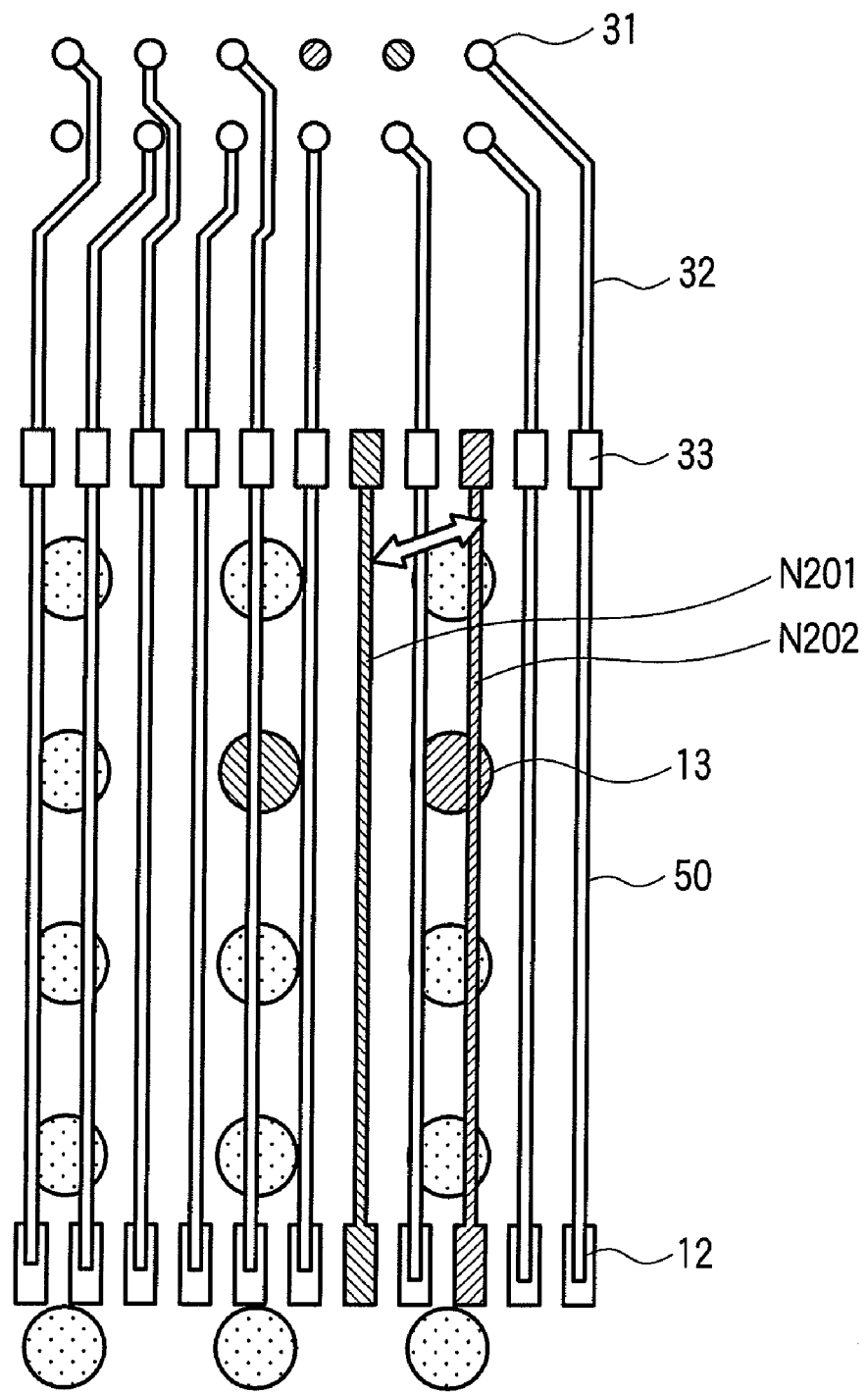
FIG. 14 is a plan view showing the state in which allocation of the specified nets to bonding wires is changed in the second embodiment.

In step S205, bonding wire allocations of the specified nets N201, N202 are changed. In FIG. 14, as indicated by an arrow, net allocations of the bonding wires corresponding to the nets N201, N202 are swapped In step S206, the specified nets N201, N202 of the re-distribution layer routing portion 30 are routed and all of the nets of the package board routing portion 90 are routed. At this time, the global positions of via holes are rearranged. The result of routing obtained at this time is shown in FIG. 15.

In step S207, whether a correction of the routing performed in steps S204 to S206 is accepted or not is determined. If the correction is accepted, the process proceeds to step S209, and if not, the process proceeds to step S208.

Figure 15:
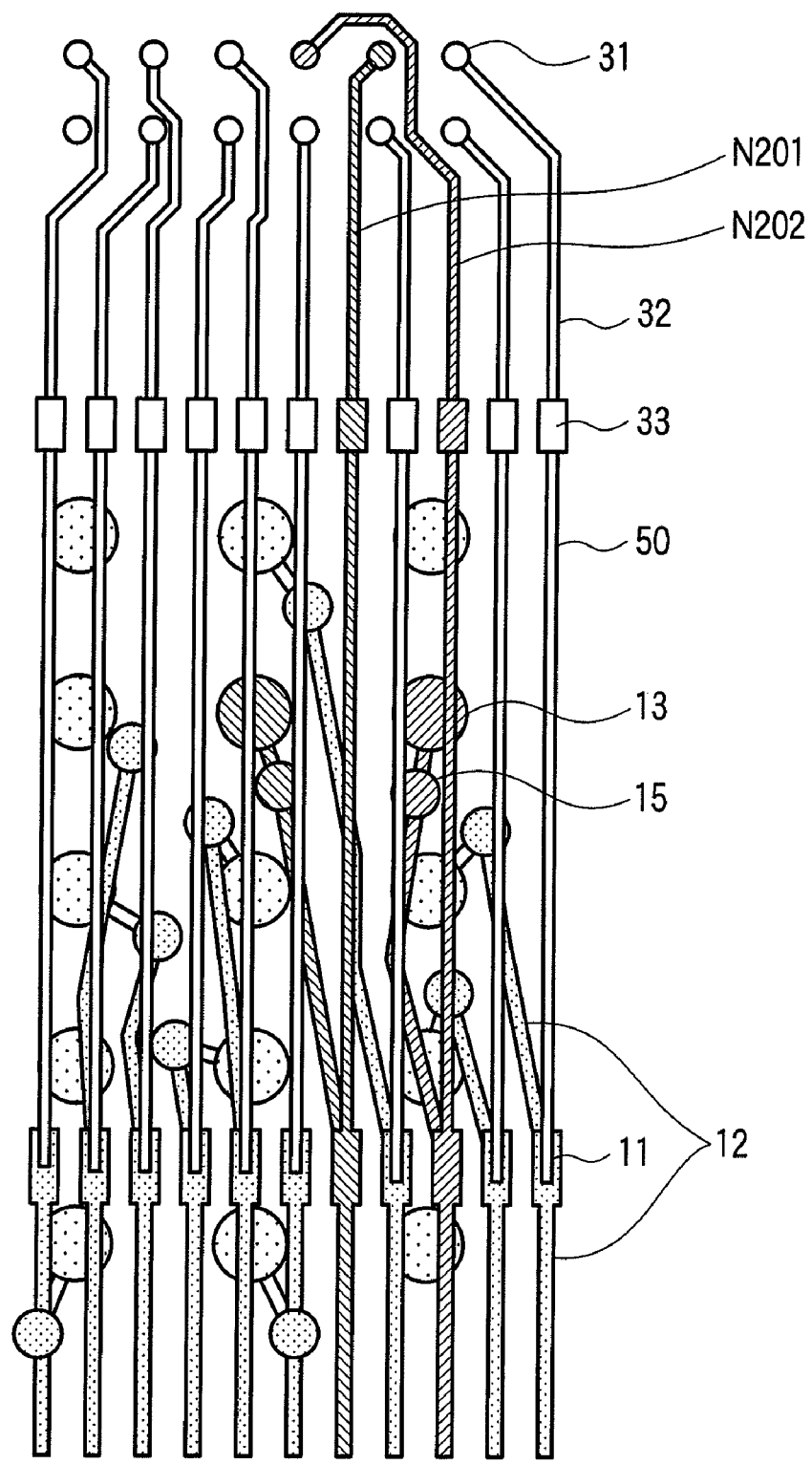
FIG. 15 is a plan view showing the state in which the specified nets are rerouted in the second embodiment.

In the example of this embodiment, since the DRC error present in FIG. 11 is eliminated in FIG. 15, it is understood that improvement is made and the correction is accepted. If the number of DRC errors increases and the result of correction becomes worse, the correction is not accepted and the state before correction is restored in step S208.

In step S209, whether the process is terminated or not is determined. If the process is not terminated, another DRC error is selected in step S201 and the process from step S201 to S209 is repeatedly performed.

By performing the above procedure, the re-distribution layer routing portion 30 and package board routing portion 90 can be simultaneously optimized and the routing result with better quality in comparison with the conventional technique can be attained.

Thus, according to this embodiment, since not only the routes of the specified nets are removed but also the via positions of the specified nets are rearranged, a magnificent improvement effect in comparison with that of the first embodiment can be expected although a longer processing time than in the first embodiment is required.

MODIFICATION

This invention is not limited to the above embodiments. In the above embodiment, a case wherein two LSI chips are stacked is explained, but this invention can be applied to the structure in which three or more LSI chips are stacked.

Further, this invention is not limited to the routing designs of the package board routing portion and re-distribution layer routing portion, but can be applied to the routing design of first and second routing portions that are connected to each other via bonding wires. For example, this invention can be applied to the routing design for connecting LSI chips arranged in different positions on the package board via bonding wires.

Further, the apparatus to which this invention is applied is not limited to that of FIG. 9, and can be properly modified according to the specification. In addition, this invention is not always realized by using a computer, and can be realized by means of individual hardware structures that perform the respective steps shown in FIG. 3.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A routing design method comprising:
    determining with a computer device whether a design rule check (DRC) error of one of first and second routing portions is present in a system in package (SiP) having large scale integrated circuit (LSI) chips stacked on a package board that has via holes formed to connect upper and lower routes and having the first and second routing portions that are connected to each other via bonding wires and selecting the DRC error when the DRC error is present,
    specifying a plurality of nets associated with the selected DRC error,
    removing at least part of routes of the specified nets,
    changing bonding wire allocations of the specified nets,
    rerouting nets that are subjected to the route removal and bonding wire allocation changing while occurrence of a DRC error is prevented after the removal and allocation changing, and
    determining whether a result of the rerouting is accepted,
    wherein correction is accepted if improvement is made when the DRC error is eliminated at time of determining whether the result of rerouting is accepted, and correction is not accepted and a state before correction is restored when the DRC error is not improved.

2. The method according to claim 1, wherein the first routing portion is formed on the package board, first LSI chip is mounted on a central portion of the package board and electrically connected to the first routing portion, the second routing portion is formed on a peripheral portion of the first LSI chip, and second LSI chip is mounted on a central portion of the first LSI chip and electrically connected to the second routing portion.

3. The method according to claim 1, wherein the net specifying, the removing at least part of routes, the changing the bonding wire allocations, the net rerouting and the determining the routing result are repeatedly performed for each selected DRC error.

4. The method according to claim 1, wherein the routes of the specified nets of one of the first and second routing portions and the routes of all of the nets of the other routing portion are removed at route removal time, via positions of the specified nets are re-determined before rerouting, and the specified nets of one of the first and second routing portions and all of the nets of the other routing portion are rerouted while occurrence of a DRC error is prevented at time of rerouting.

5. The method according to claim 4, wherein the first routing portion is formed on the package board, the first LSI chip is mounted on a central portion of the package board and electrically connected to the first routing portion, the second routing portion is formed on a peripheral portion of the first LSI chip, and the second LSI chip is mounted on a central portion of the first LSI chip and electrically connected to the second routing portion.

6. The method according to claim 4, wherein the net specifying, the removing at least part of routes, the changing the bonding wire allocations, the net rerouting and the determining the routing result are repeatedly performed for each selected DRC error.

7. The method according to claim 4, wherein correction is accepted if improvement is made when the DRC error is eliminated at time of determining whether the result of rerouting is accepted, and correction is not accepted and a state before correction is restored when the DRC error is not improved.

8. A routing design apparatus comprising:
    a selection module that determines whether a design rule check (DRC) error of one of first and second routing portions is present in a system in package (SiP) having large scale integrated circuit (LSI) chips stacked on a package board that has via holes formed to connect upper and lower routes and having the first and second routing portions that are connected to each other via bonding wires and selects the error when the DRC error is present,
    a net specification module that specifies a plurality of nets associated with the selected DRC error,
    a route removal module that removes at least part of routes of the specified nets,
    a net allocation changing module that changes bonding wire allocations of the specified nets,
    a rerouting module that reroutes nets that are subjected to the route removal step and bonding wire allocation changing step while occurrence of a DRC error is prevented, and
    a determination module that determines whether a result of the rerouting is accepted,
    wherein the determination module accepts correction if improvement is made when the DRC error is eliminated, and does not accept correction and restores a state before correction when the number of DRC errors increases and the result of correction becomes worse.

9. The apparatus according to claim 8, wherein the first routing portion is formed on the package board, the first LSI chip is mounted on a central portion of the package board and electrically connected to the first routing portion, the second routing portion is formed on a peripheral portion of the first LSI chip, and the second LSI chip is mounted on a central portion of the first LSI chip and electrically connected to the second routing portion.

10. The apparatus according to claim 8, wherein the selection module selects an error one by one when the DRC errors are present, and the net specification module, the route removal module, the net allocation changing module, the rerouting module and the determination module are repeatedly operated for each selected DRC error.

11. The apparatus according to claim 8, which further comprises a re-determination module that re-determines via positions of the specified nets and in which the route removal module removes the routes of the specified nets of one of the first and second routing portions and the routes of all of the nets of the other routing portion, and the rerouting module reroutes the specified nets of one of the first and second routing portions and all of the nets of the other routing portion while occurrence of a DRC error is prevented.

12. The apparatus according to claim 11, wherein the first routing portion is formed on the package board, the first LSI chip is mounted on a central portion of the package board and electrically connected to the first routing portion, the second routing portion is formed on a peripheral portion of the first LSI chip, and the second LSI chip is mounted on a central portion of the first LSI chip and electrically connected to the second routing portion.

13. The apparatus according to claim 11, wherein the selection module selects an error one by one when the DRC errors are present, and the net specification module, the route removal module, the net allocation changing module, the rerouting module and the determination module are repeatedly operated for each selected DRC error.

14. The apparatus according to claim 11, wherein the determination module accepts correction if improvement is made when the DRC error is eliminated, and does not accept correction and restores a state before correction when the number of DRC errors increases and the result of correction becomes worse.

15. A non-transitory recording medium comprising:
a routing design program that is read by a computer and used to optimize routes of routing portions by computer control with respect to a system in package (SiP) having large scale integrated circuit (LSI) chips stacked on a package board that has via holes formed to connect upper and lower routes and having first and second routing portions that are connected to each other via bonding wires,
wherein the program causes the computer to perform:
a process of determining whether a design rule check (DRC) error is present in one of the first and second routing portions and selecting the DRC error when the DRC error is present,
a process of specifying a plurality of nets associated with the selected DRC error,
a process of removing at least part of routes of the specified nets,
a process of changing bonding wire allocations of the specified nets,
a process of rerouting nets that are subjected to the route removal step and bonding wire allocation changing step while occurrence of a DRC error is prevented after the separating and allocation changing processes, and
a process of determining whether a result of the rerouting is accepted,
wherein correction is accepted if improvement is made when the DRC error is eliminated in the process of determining whether the result of rerouting is accepted, and correction is not accepted and a state before correction is restored when the DRC error is not improved.

16. The medium according to claim 15, wherein the net specification process, the route removal process, the bonding wire allocation changing process, the net rerouting process and the routing result determination process are repeatedly performed for each selected DRC error.

17. The medium according to claim 15, wherein the routes of the specified nets of one of the first and second routing portions and the routes of all of the nets of the other routing portion are removed in the route removal process, via positions of the specified nets are re-determined before the rerouting process and the specified nets of one of the first and second routing portions and all of the nets of the other routing portion are rerouted while occurrence of a DRC error is prevented in the rerouting process.

* * * * *